United States Patent
Bains

(10) Patent No.: US 11,704,194 B2
(45) Date of Patent: *Jul. 18, 2023

(54) MEMORY WORDLINE ISOLATION FOR IMPROVEMENT IN RELIABILITY, AVAILABILITY, AND SCALABILITY (RAS)

(71) Applicant: Intel Corporation, Santa Clara, CA (US)

(72) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/530,086

(22) Filed: Nov. 18, 2021

(65) Prior Publication Data

US 2022/0075689 A1 Mar. 10, 2022

Related U.S. Application Data

(63) Continuation of application No. 16/722,969, filed on Dec. 20, 2019, now Pat. No. 11,210,167.

(60) Provisional application No. 62/927,116, filed on Oct. 28, 2019.

(51) Int. Cl.
G06F 11/00 (2006.01)
G06F 11/10 (2006.01)
G06F 13/16 (2006.01)

(52) U.S. Cl.
CPC ...... *G06F 11/1068* (2013.01); *G06F 13/1668* (2013.01)

(58) Field of Classification Search
CPC ...... G06F 11/1068; G06F 13/16; G06F 11/00; G06F 13/1668
See application file for complete search history.

(56) References Cited

U.S. PATENT DOCUMENTS

| | | | | |
|---|---|---|---|---|
| 5,164,944 A | * | 11/1992 | Benton | G06F 11/1016 714/767 |
| 6,792,567 B2 | * | 9/2004 | Laurent | G06F 11/1044 714/763 |
| 8,117,519 B2 | * | 2/2012 | Ito | G11C 11/4096 714/766 |
| 8,443,263 B2 | | 5/2013 | Selinger et al. | |
| 9,098,430 B2 | | 8/2015 | Kim | |
| 9,384,128 B2 | | 7/2016 | Tuers et al. | |
| 9,606,865 B2 | | 3/2017 | Yang et al. | |

(Continued)

OTHER PUBLICATIONS

First Office Action for U.S. Appl. No. 16/722,969, dated May 12, 2021, 12 pages.

(Continued)

*Primary Examiner* — Esaw T Abraham
(74) *Attorney, Agent, or Firm* — Compass IP Law PC

(57) ABSTRACT

A memory device that performs internal ECC (error checking and correction) can treat an N-bit channel as two N/2-bit channels for application of ECC. The memory device includes a memory array to store data and prefetches data bits and error checking and correction (ECC) bits from the memory array for a memory access operation. The memory device includes internal ECC hardware to apply ECC, with a first group of a first half the data bits checked by a first half of the ECC bits in parallel with a second group of a second half of the data bits checked by a second half of the ECC bits.

20 Claims, 8 Drawing Sheets

(56) References Cited

U.S. PATENT DOCUMENTS

| | | | |
|---|---|---|---|
| 9,823,964 B2 * | 11/2017 | Reed | G06F 3/0688 |
| 9,886,341 B2 | 2/2018 | Das | |
| 10,049,006 B2 * | 8/2018 | Reed | G06F 3/0619 |
| 10,268,541 B2 | 4/2019 | Niu et al. | |
| 10,482,947 B2 * | 11/2019 | Cox | G06F 3/0673 |
| 10,533,285 B2 | 1/2020 | Candutti | |
| 10,606,696 B2 * | 3/2020 | Cadigan | G11C 29/52 |
| 10,628,343 B2 | 4/2020 | Lee | |
| 10,679,788 B2 | 6/2020 | Hsieh et al. | |
| 2013/0007564 A1 | 1/2013 | Bedeschi | |
| 2017/0004035 A1 | 1/2017 | Suh et al. | |
| 2017/0024276 A1 | 1/2017 | Kanno | |
| 2017/0075756 A1 | 3/2017 | Noguchi et al. | |
| 2017/0286217 A1 | 10/2017 | Kreifels | |
| 2018/0107539 A1 | 4/2018 | Won | |
| 2018/0210787 A1 | 7/2018 | Bains et al. | |
| 2019/0006001 A1 | 1/2019 | Chun et al. | |
| 2019/0050316 A1 | 2/2019 | Kim et al. | |
| 2019/0243566 A1 | 8/2019 | Hassan et al. | |

OTHER PUBLICATIONS

Notice of Allowance for U.S. Appl. No. 16/722,969, dated Aug. 27, 2021, 8 pages.

* cited by examiner

MEMORY WORDLINE ISOLATION FOR IMPROVEMENT IN RELIABILITY, AVAILABILITY, AND SCALABILITY (RAS)

PRIORITY

This application is a Continuation of, and claims the benefit of priority of, U.S. application Ser. No. 16/722,969, filed Dec. 20, 2019, now U.S. Pat. No. 11,210,167, which in turn claims the benefit of priority of U.S. Provisional Application No. 62/927,116, filed Oct. 28, 2019, the content of which are incorporated herein by reference in their entirety.

FIELD

Descriptions are generally related to memory devices, and more particular descriptions are related to an architecture to improve RAS (reliability, availability, and scalability) through error handling.

BACKGROUND

The overhead required for error handling in memory channels continues to increase as narrower channels are used. The error handling overhead can be referred to as RAS (reliability, availability, serviceability) overhead, referring to the fact that the error handling is used to meet RAS expectations. RAS expectations often include an expectation for a full SDDC (single device data correction) capability, where an error resulting from a full device failure can be corrected.

Legacy SDDC operation has a 12.5% overhead, with 8 ECC (error checking and correction, also often referred to as error correction coding) bits per 64 data bits. Newer memory systems with narrower channels still require the 8 ECC bits for SDDC operation, but with a 32-bit channel, the overhead becomes 25%.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
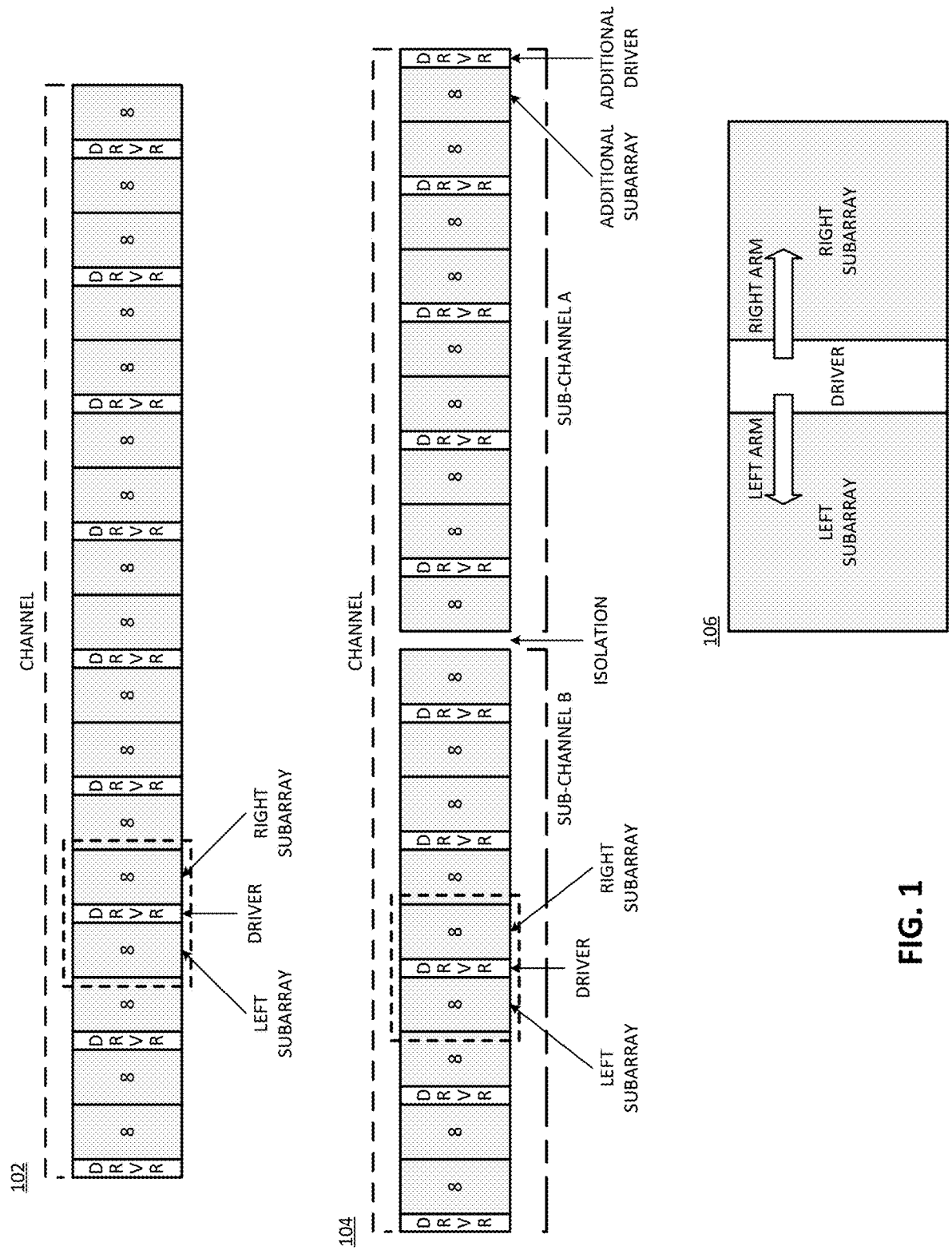
FIG. 1 is a block diagram of an example of a memory architecture with an additional driver to isolate data relative to a traditional architecture.

Descriptions of certain details and implementations follow, including non-limiting descriptions of the figures, which may depict some or all examples, and well as other potential implementations.

DETAILED DESCRIPTION

As described herein, a memory device is segmented into separate portions for ECC (error checking and correction) isolation for application of internal or on-die ECC. The different portions can still be treated at the system level by the memory controller as one segment for external or system level ECC. Thus, internal ECC can separately correct two sub-channels while the system level ECC would correct the entire channel. The internal ECC isolation enables the memory device to use less overhead to provide the same level of ECC. Additional ECC bits available can be used as additional metadata.

A memory device that performs internal ECC can treat an N-bit channel as two N/2-bit channels for application of ECC. The segmenting of the N-bit channel can refer to treating data bits for the N signal lines of the channel as two groups of N/2 bits each or two portions of N/2 signal lines. The memory device applies ECC to N bits of ECC data corresponding to the N signal lines of the channel. The ECC for an N/2-bit channel is simpler than the ECC for N bits, and thus, each N/2-bit portion can be separately correctable when treated as two N/2-bit portions. The memory device can include an additional hardware for the application of ECC to the channel as two sub-channels. For example, the memory device can include an additional subarray to store ECC bits for the internal ECC to enable the application of ECC to two sub-channels of the N-bit channel. The memory device can include an additional driver to access the additional subarray when applied.

For example, a ×4 memory device can be treated internally as two ×2 devices. Correction of errors for a ×2 device requires less RAS (reliability, availability, and serviceability) overhead than for a ×4 device. RAS code can target fixing common memory error types such as single bit, single sub-wordline (SWL) driver, or one arm of a SWL driver. Reference to a sub-wordline can refer to an architecture that sub-divides a wordline to reduce driver loading, and is sometimes referred to as a local worldline (LWL). Experimentation has indicated that full device (e.g., full die) failure is quite uncommon relative to the failures mentioned above. The architecture provided allows for less costly correction of the more common failures while still enabling correction of full device failure.

The SWL or LWL can be considered a portion of a master wordline (MWL) or global wordline (GWL), depending on the terminology used. In general, the MWLs/GWLs are segmented down into smaller chunks within a memory device until the driver can meet latency requirements for the memory device. The segmentation of the device could be different for different types of memory, different from different memory manufacturers, or for different driver designs.

RAS overhead for a full SDDC (single device data correction) continues to increase as memory systems use narrower channels or chipkill solution. The RAS overhead can alternatively be referred to as ECC (error checking and correction) overhead. The expression RAS overhead refers to the overall goals for error correction, while the expression ECC overhead refers more specifically to the mechanism for correction to achieve the desired RAS goals.

The ECC isolation described can reduce the ECC overhead by half for internal ECC, and reduce the DIMM (dual inline memory module) power. A memory device implementing the ECC isolation can be described as having failure mode isolated to a limited number of I/O (input/output) pins. For example, a DRAM device in a ×4 implementation can be limited to having failures modes isolated in two DQ instead of having failures across all 4 DQ signal lines. In one example, different implementations can have different isolation granularity per device. The isolation granularity could be defined by a standard.

The channel width for DDR5 is half that of DDR4 (e.g., 32 bits versus 64 bits), which allows keeping the same internal cycle times in the memory core, while transferring out at higher speeds. Changing the internal core cycle time has a significantly higher cost than adjusting the I/O cycle time. DDR5 has a burst length of BL18 to transmit 64 bits plus ECC bits per device. The total interface would be 32 bit-wide channel divided among 4 devices for a ×8 implementation or 8 devices for a ×4 implementation.

In general, to perform SDDC, the system requires a number of ECC bits equal to twice the device interface. Thus, a ×4 implementation requires 8 ECC bits on the channel, and a ×8 interface would require 16 ECC bits. SDDC may be impractical for ×8 but is more manageable for ×4 implementations. As the channel goes from 64b data+8b ECC to 32b data+8b ECC, an additional ECC device would be required to meet the same RAS performance as legacy systems.

FIG. 1 is a block diagram of an example of a memory architecture with an additional driver to isolate data relative to a traditional architecture. Memory segment 102 represents a portion of a memory array to provide data for a data channel to which a memory device is connected. A DDR5 (double data rate version 5) data channel has a 32b data bus width with 16b for ECC, which would result in a 25% RAS/ECC overhead. By contrast, a DDR4 (double data rate version 4) data channel has a 64b data bus width with 8 bits for ECC, which results in 12.5% overhead.

Segment 102 can include a subwordline (SWL) driver that drives 8 bits of data to each side. As illustrated, the dashed box shows 16 bits of data driven by the driver (DRVR) in the middle of the bits. The bits to the left of the driver can be considered a left subarray or a left arm of the driver. Similarly, the bits to the right of the driver can considered a right subarray or a right arm of the driver. It will be understood that right and left are relative terms, and refer only to a diagrammatic orientation. In an actual implementation, the bits considered left or right could be switched. Thus, the description of left and right arms refers only to the fact that a driver between a group of bits or memory cells or memory locations drives bits to either physical side of the driver circuitry side to reduce the length of the signal lines needed to be driven between the driver circuitry and the memory cells or bitcells of the memory array. There will be bits driven out each direction from the active components of the driver. It will be understood that as illustrated, a failure of one arm (SWL arm) results in an 8b failure because one arm fails and thus one subarray becomes inaccessible. A failure of the driver (SWL driver failure) results in a 16b failure seeing that both arms become inaccessible.

Segment 104 illustrates a channel like the channel for segment 102, but with an additional driver and additional subarray. Segment 104 can be considered to be further segmented or partitioned into sub-channel A and sub-channel B, with isolation in between the sub-channels. Each driver in segment 104 includes at least a left subarray or a right subarray, with most drivers having both left and right subarrays. The drivers at the edges may only have one arm. The isolation in the middle can be considered a logical separation and may not be physical separation of the hardware. Thus, for example, the isolation can refer to the fact that for purposes of ECC, one ECC circuit provides ECC for one sub-channel and a separate ECC circuit provides ECC for another sub-channel. With the isolation hardware, the memory can provide ECC protection of the full channel as two separate sub-portions, which simplifies the ECC overhead.

Segment 104 can provide isolation of the data that is fetched from the memory array. In one example, the additional driver allows the single channel to be treated as two separate portions. Adding the driver can enable the accessing of the data in two separate portions for ECC operations. The additional driver allows the channel to be sub-divided for purposes of applying internal ECC to a smaller portion of data, and thus limiting errors to sub-portions of the overall memory interface. Diagram 106 illustrates more detail of a driver, with the left arm to one side and the right arm to the other side. The right arm drives the right subarray and the left arm drives the left subarray.

In one example, memory segment 104 can be part of a memory device that has a common die implementation. A common die implementation refers to a memory device that is architected to be configurable as either a ×4 or a ×8 device. Such a device will have internal logic to route bits to selected I/O pins. The internal logic can include control logic as well as hardware circuitry to route bits to segments of memory. In a common die implementation, in one example, the additional driver is not needed when ECC isolation is not used, for example, in a ×8 implementation of the device. The memory array can be architected to allow the selective use of an additional driver for ECC isolation without significant waste of addressable memory space. Thus, the additional subarray can be used in other ways without needing to have a driver be active. Alternatively, selected drivers could be architected as dual drivers for different implementations, where it drives only one arm instead of two arms.

Figure 2:
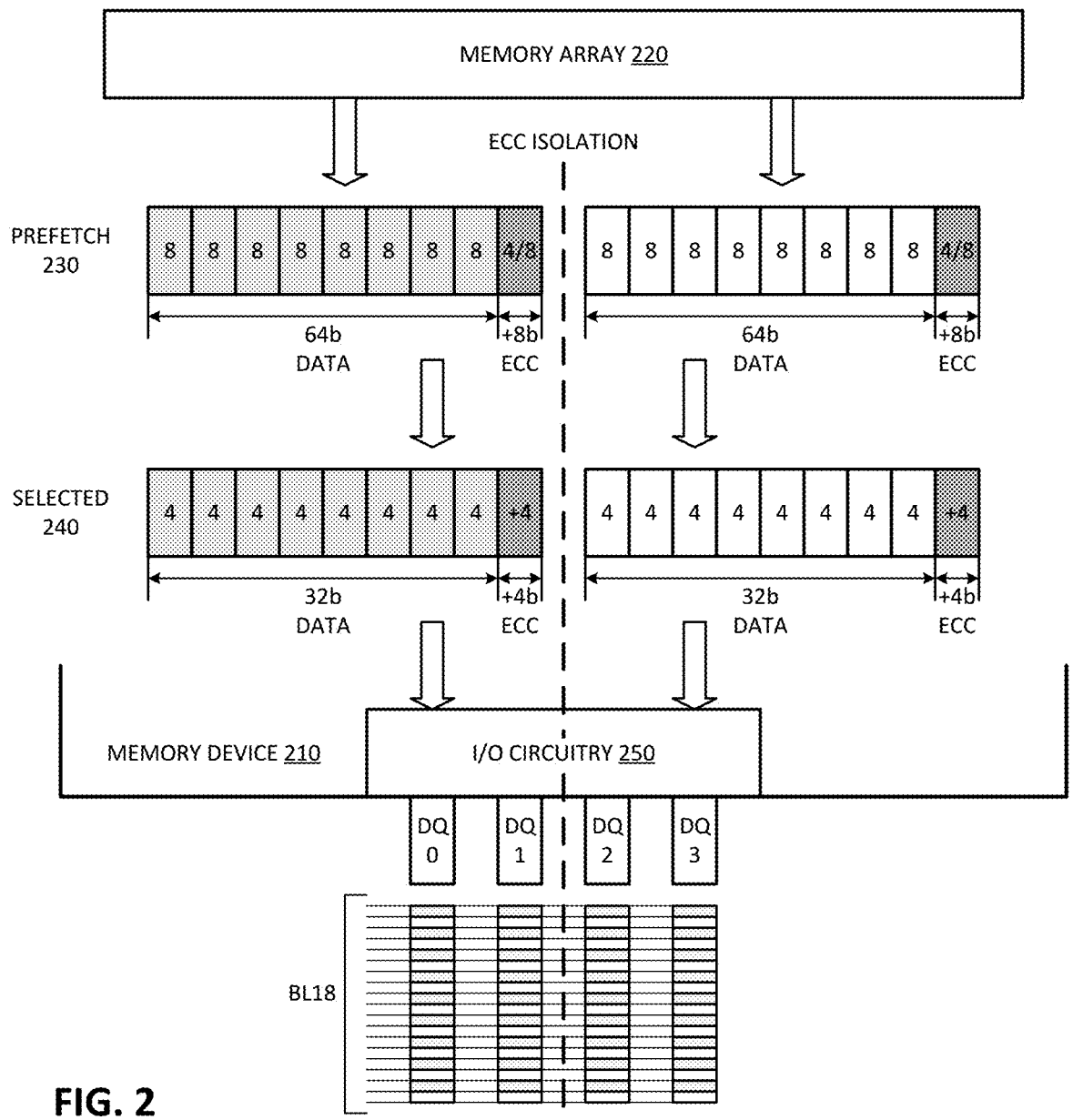
FIG. 2 is a block diagram of an example of a data architecture for the memory architecture of FIG. 1.

FIG. 2 is a block diagram of an example of a data architecture for the memory architecture of FIG. 1. Diagram 202 represents a core memory architecture, such as a DDR5 implementation. As illustrated, the memory core performs a 128b internal prefetch, and includes 8b ECC for internal ECC. It will be understood that a ×8 implementation would use all 128 bits of data, whereas a ×4 implementation would prefetch the 128 bits, and only 64 bits would be used in any given memory access (e.g., read or write) operation. A ×4 implementation refers to an implementation where a memory device having the array of diagram 202 includes an interface to four data signal lines or four bits of a data bus, which could be said to be an implementation where M=4 if M represents the number of signal lines. A ×8 implementation refers to an implementation where a memory device having the array of diagram 202 includes an interface to eight data signal lines or eight bits of a data bus, which could be said to be an implementation where M=4.

In a ×8 implementation, 128 bits can be exchanged with the host or the associated memory controller for each memory access transaction, based on 8 signal lines with a burst length of 16 (BL16), since 8*16=128. Thus, as illustrated, both the upper half of the array and the lower half of the array provide 64b of data each. The upper half can be based on the architecture of the memory and the addressing structure, which is not specifically shown in diagram 202. If the lightly shaded block of diagram 202 represent the upper half, the non-shaded blocks represent the lower half, and vice versa. The darkly shaded bits represent the ECC bits. For a ×4 implementation, 64 bits can be exchanged with the host or associated memory controller for each memory access transaction, based on 4 signal lines over BL16 (4*16=64). As illustrated, the 64b of data can be fetched from the lower half, or from the upper half, or can be split between the upper and lower halves. A split of the halves implies use of only 4b of each 8b from a subarray. In such an implementation, ECC will not cover SWL driver or MWL faults.

Diagram 204 illustrates a similar architecture as diagram 202, but including isolation. Diagram 204 specifically illustrates the application of memory device 210 with I/O circuitry 250 to interface with 4 DQ (data) signal lines, DQ[3:0]. Memory device 210 includes memory array 220, showed in prefetch 230 to be separated into different subarrays.

Diagram 204 can correspond to memory segment 104 of FIG. 1. As illustrated, diagram 204 includes a memory array to provide data for prefetch. The prefetch includes 128 bits of data as with diagram 202, and includes either 4 or 8 bits of ECC data per isolated portion. As illustrated, 8 bits of ECC data are shown for each sub-portion or subarray. In one example, only 4 bits of ECC are provided per sub-portion. In one example, additional ECC bits can be used for other purposes, such as directory information, two level memory (2LM) metadata, data integrity features, or some other purpose. In another example, ECC bits can be used for on die single bit error correction and not transferred to the host. In such an example, data can be transferred over BL16 to the host.

It will be understood that when not all prefetched data is used, all the prefetched data can be placed in the sense amplifier, and then only selected data will be used for the memory access. Thus, prefetch 230 can represent data in the sense amplifier, and selected 240 represents data from the sense amplifier that is sent to the I/O for a Read operation.

For example, data can be placed into the sense amp and then addressing operates to select specific portions of the data to be written for a write operation or read out for a read operation. The addressing can select the data in any manner that makes sense for the architecture. In one example, the additional hardware for isolation (e.g., driver and other logic) in each bank (e.g., edge sub-wordline driver) may add only approximately 1-2 percent die size.

In one example, a portion of the prefetched data is selected for the access operation. As illustrated, 4 bits of 8 bits are selected from each subarray. The selection per subarray enables the operation of internal ECC to correct errors occurring in the driver as well as the driver arm. A failure of a SWL arm or SWL driver will only impact two of the DQ bits (either the upper or the lower 2 DQs). Such a failure does not result in a loss in bank resources for a ×4 implementation.

For a Write operation, the arrows in diagram 204 could be reversed, where selected data is received from I/O circuitry 250, and provided from the I/O circuitry to selected locations of the sense amplifier circuit at 230. Instead of being prefetched to the sense amplifier for a Write operation, the sense amplifier array can be driven to the corresponding selected subarrays of memory array 220. Similarly to a Read operation, the addressing of the sense amplifier elements can determine what is written to the memory array.

In one example, routing in the spine of memory device 210 for a dedicated ×4 device is 72b versus 136b for a common ×4/×8 device, which results in a 2-3% die saving. The implementation of a dedicated part could thus offset the die area cost for isolation.

As illustrated in diagram 204, the selected data and ECC bits can be routed to I/O circuitry 250 of memory device 210. The arrows point down to illustrated a read, but it will be understood that for a write, data will come into memory device 210 to the selected bits to be written back to memory array 220. In one example, the 36 bits per isolated side are transferred over BL18 per two DQ signal lines. The illustration of BL18 is only one example. In another example, the system transfers bits over BL16. The total for the device is 72 bits over 4 DQ signal lines, but treated internally as two ×2 interfaces. While not specifically illustrated, the I/O circuitry can include ECC circuitry, or ECC circuitry can be located on the input/output path between the sense amps and I/O circuitry 250. The result of the architecture of diagram 204 is 8b ECC per 64b of data available with BL18, which has a 12.5% RAS overhead, similar to legacy systems.

It will be understood that a specific example is provided with specific numbers of data and ECC bits for a specific number of I/O signal lines. These specific examples are illustrative but not limiting. In general, a channel of N bits can be subdivided into different portions for internal ECC, such as two N/2-bit sub-portions or sub-channels. The N bits can be the entire amount of data to be transferred over the burst length (e.g., 64 bits which is the pure data bits, excluding the ECC bits). The subdivision could alternatively be considered on the interface width (e.g., a ×4 channel treated as two separate ×2 sub-channels). Thus, an N-bit channel can generally refer to the N bits of data that are sent over a number of M signal lines over a burst length. In one example, the channel interface could be alternatively referenced, referring to an M-bit interface that the data bits are sent or received over. Typically, the ECC bits apply to the entire payload of data bits received over all signal lines for the burst length, and reference to application of ECC bits to a channel will generally be understood to refer to all bits covered by the ECC bits.

The subdivision can treat the bits or the interface to the data bus as though the different portions are isolated, which can refer to isolation for purposes of performing ECC operations. The system level ECC implemented by an associated memory controller or host can treat all bits or signal lines as a single channel, instead of treating the bits or signal lines as two separate, isolated channels as in diagram 204. Thus, for example, the memory device can treat the N bits as two portions of N/2 bits with separate ECC, while the host treats the N bits as N bits for system-level ECC. Such an approach enables the correction within the memory device of a portion of the channel, being able to reconstruct the data with less ECC overhead. The isolation allows the memory device to more specifically isolate an error for purposes of ECC correction. As another example, the memory device can treat the N signal lines of the data bus interface as two portions of N/2 signal lines with separate ECC, while the host treats the N signal lines of the data bus interface as an N-bit channel for system-level ECC. The implementation can be different for different interface and internal array sizes, but the result will be a reduction in ECC overhead on a system level while providing the ability to perform internal ECC at a higher performance. System-level ECC refers to ECC provided by the host or associated memory controller, which provides ECC operation on data from multiple memory devices in parallel.

Figure 3:
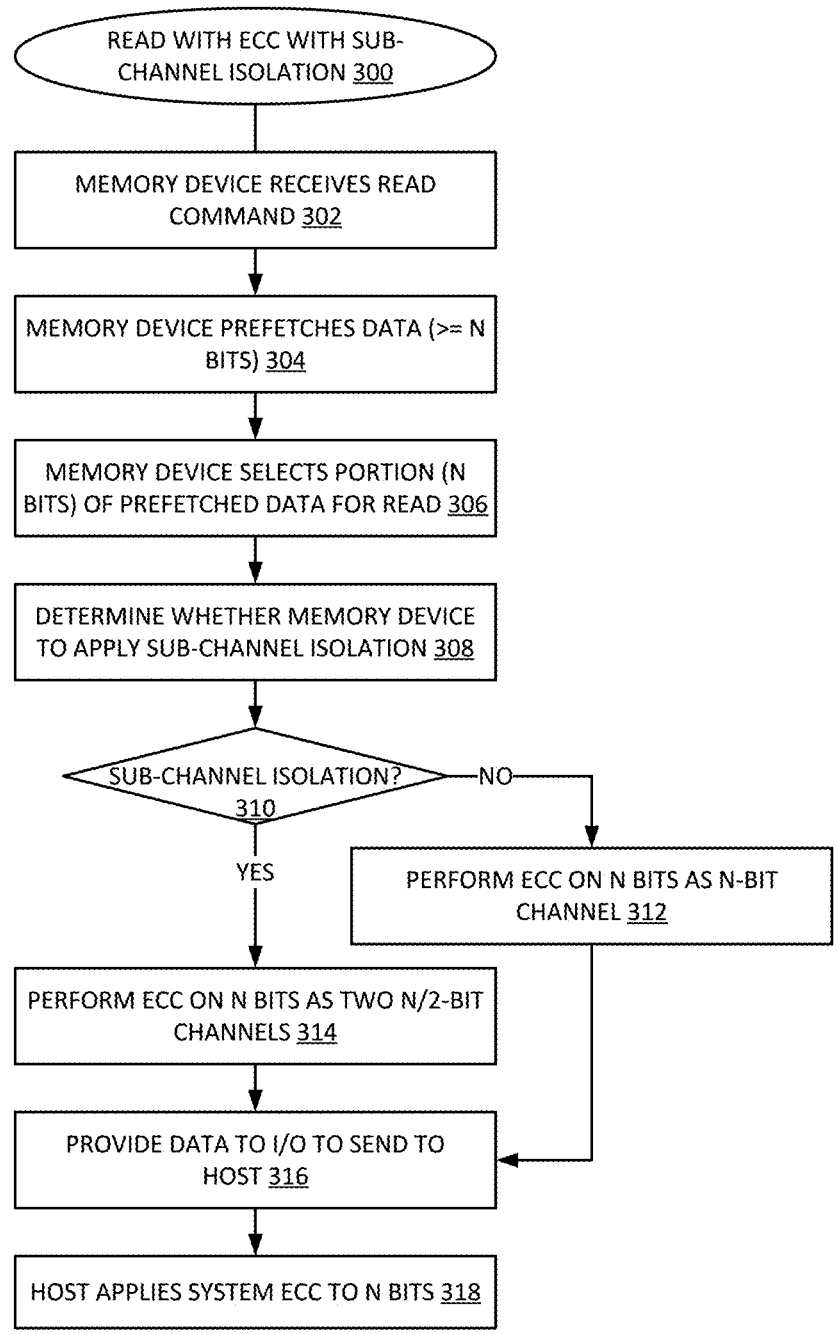
FIG. 3 is a flow diagram of an example of a process for applying ECC for a read command in a system that has ECC sub-channel isolation.

FIG. 3 is a flow diagram of an example of a process for applying ECC for a read command in a system that has ECC sub-channel isolation. Process 300 provides an example of performing a read operation with a memory device having ECC with sub-channel isolation. Process 300 can be implemented, for example, by memory device 210 of diagram 204 of FIG. 2.

The memory device receives a read command from the host, block 302. In one example, the memory device prefetches data to service the read, with the amount of data being greater than or equal to N bits, block 304. In one example, the memory device selects a portion of the prefetched data for the read operation, where the amount of data selected is N bits, block 306.

In one example, the memory device can be configured to either apply sub-channel isolation for ECC or not apply sub-channel isolation. The system can determine the configuration of the memory device, block 308. If sub-channel isolation is not to be applied, block 310 NO branch, the memory device can perform ECC on the N bits as an N-bit channel, block 312.

If sub-channel isolation is to be applied, block 310 YES branch, the memory device can perform ECC on the N bits as two N/2 bit channels, block 314. Similar to what is described above, the application of ECC on N/2 bits can be on the total bits themselves, or on the portion of the bits of the data bus.

Once ECC is applied, either as one channel or two sub-channels, the memory device provides the data to the I/O circuitry to send the data to the host, block 316. In one example, the host applies system ECC to the N bits of data as a single N-bit channel, block 318.

Figure 4:
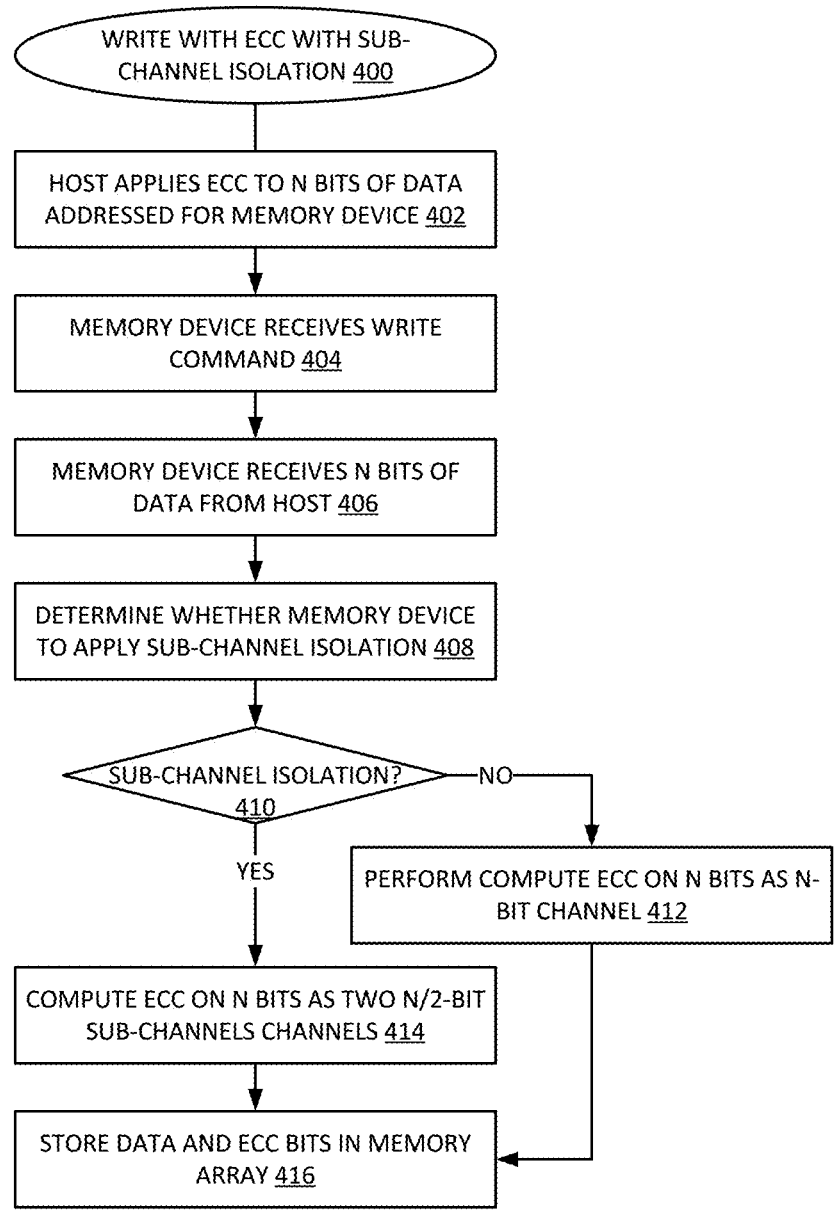
FIG. 4 is a flow diagram of an example of a process for applying ECC for a write command in a system that has ECC sub-channel isolation.

FIG. 4 is a flow diagram of an example of a process for applying ECC for a write command in a system that has ECC sub-channel isolation. Process 400 provides an example of performing a write operation with a memory device having ECC with sub-channel isolation. Process 400 can be implemented, for example, by memory device 210 of diagram 204 of FIG. 2.

In one example, the host or associated memory controller applies ECC to N bits of data addressed for the memory device, block 402. The host sends a write command which is received by the memory device, block 404. Either with the write command, or some time delay after the command, the memory device receives N bits of data from the host associated with the write command, block 406.

In one example, the memory device can be configured to either apply sub-channel isolation for ECC or not apply sub-channel isolation. The system can determine the configuration of the memory device, block 408. If sub-channel isolation is not to be applied, block 410 NO branch, the memory device can compute ECC on the N bits of data as an N-bit channel, block 412.

If sub-channel isolation is to be applied, block 410 YES branch, the memory device can compute ECC for the N bits of data as two N/2 bit channels, block 414. Similar to what is described above, the application of ECC on N/2 bits can be on the total bits themselves, or on the portion of the bits of the data bus. Once ECC is computed, either as one channel or two sub-channels, the memory device can store the data and associated ECC bits in the memory array of the memory device, block 418.

Figure 5:
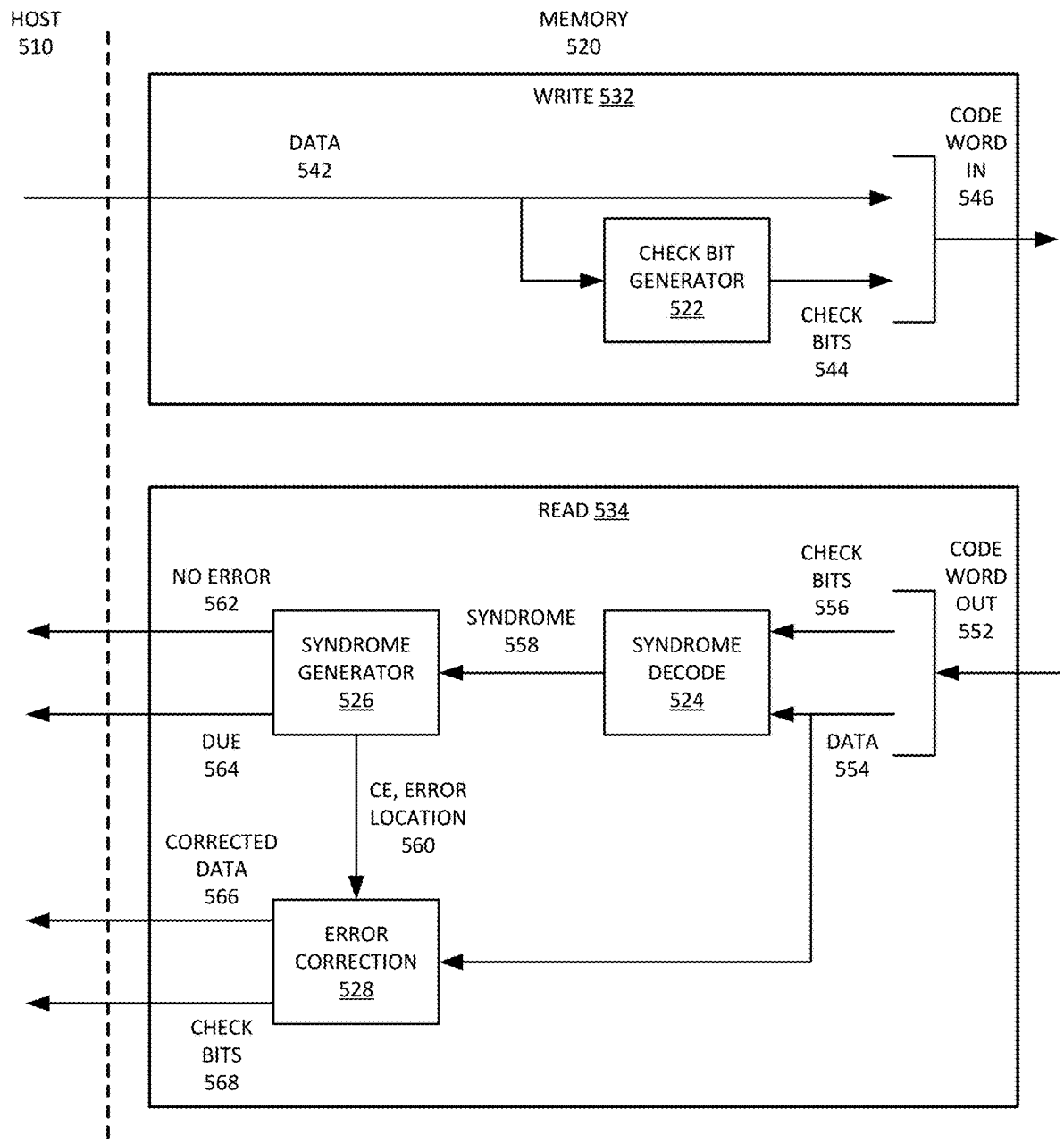
FIG. 5 is a block diagram of an example of an on-die error checking and correction (ECC) subsystem to implement ECC sub-channel isolation.

FIG. 5 is a block diagram of an example of an on-die error checking and correction (ECC) subsystem to implement ECC sub-channel isolation. System 500 provides an example of on-die ECC circuitry for a system in accordance with a system compatible with diagram 202. Host 510 includes a memory controller or equivalent or alternative circuit or component that manages access to memory 520. Host 510 performs external ECC on data read from memory 520. Memory 520 implements on-die ECC to check and correct data prior to sending the data to host 510.

System 500 illustrates write path 532 in memory 520, which represents a path for data written from host 510 to memory 520. Host 510 provides data 542 to memory 520 for writing to the memory array(s). In one example, memory 520 generates check bits 544 with check bit generator 522 to store with the data in memory. Check bits 544 can be referred to as ECC bits, and enable memory 520 to correct an error that might occur in the writing to and reading from the memory array(s). Data 542 and check bits 544 can be included as code word in 546, which is written to the memory resources.

Read path 534 represents a path for data read from memory 520 to host 510. In one example, at least certain hardware components of write path 532 and read path 534 are the same hardware. In one example, memory 520 fetches code word out 552 in response to a Read command from host 510. The code word can include data 554 and check bits 556. Data 554 and check bits 556 can correspond, respectively, to data 542 and check bits 544 written in write path 532. Thus, a read can access data and ECC bits. It will be understood that error correction in read path 534 can include the application of an XOR (exclusive OR) tree to a corresponding H matrix to detect errors and selectively correct errors (in the case of a single bit error). As is understood in the art, an H matrix refers to a hamming code parity-check matrix that shows how linear combinations of digits of the codeword equal zero. Thus, the H matrix rows identify the coefficients of parity check equations that must be satisfied for a component or digit to be part of a codeword. In one example, memory 520 includes syndrome decode 524, which enables the memory to apply check bits 556 to data 554 to detect errors in the read data. Syndrome decode 524 can generate syndrome 558 for use in generating appropriate error information for the read data. Data 554 can also be forwarded to error correction 528 for correction of a detected error.

In one example, syndrome decode 524 passes syndrome 558 to syndrome generator 526 to generate an error vector. In one example, check bit generator 522 and syndrome generator 526 are fully specified by a corresponding H matrix for the memory device. In one example, if there are no errors in the read data (e.g., zero syndrome 558), syndrome generator 526 generates a no error signal 562. In one example, if there are multiple errors in the read data (e.g., non-zero syndrome 558 that does not match any of the columns in a corresponding H matrix), syndrome generator 526 generates a DUE (detected uncorrected error) signal 564, which indicates a detected, uncorrected error. DUE signal 564 can indicate a multibit error that memory 520 was not able to correct by internal ECC.

In one example, if there is a single bit error (e.g., non-zero syndrome 558 that matches one of the columns of a corresponding H matrix), syndrome generator 526 can generate a CE (corrected error) signal with error location 560, which is a corrected error indication to error correction logic 528. Error correction 528 can apply the corrected error to the specified location in data 554 to generate corrected data 566 for output to host 510. In one example, error correction 528 also generates check bits 568, which includes the check bits for the read data.

Check bits 568 can be considered an error vector that indicates a state of errors in the read data transmitted to host 510. It will be understood that zero syndrome (no error 562) condition and a corrected SBE resulting in corrected data 566 will have the same check bits 568, indicating no error to host 510. Thus, check bits 568 will not provide information about SBE in memory 520, but only multibit errors. In one example, system 500 writes corrected data back to the memory array.

In one example, system 500 includes an internal ECC write path 532 and internal ECC read path 534 for each portion of an array. In accordance with a system compatible with diagram 202, memory device 520 can include one path for half of its I/O pins and a second path for the other half of its I/O pins. Thus, memory 520 can perform ECC isolation with hardware resources to separate the application of ECC to separate sub-portions of the overall data to be provided by the memory device.

Figure 6:
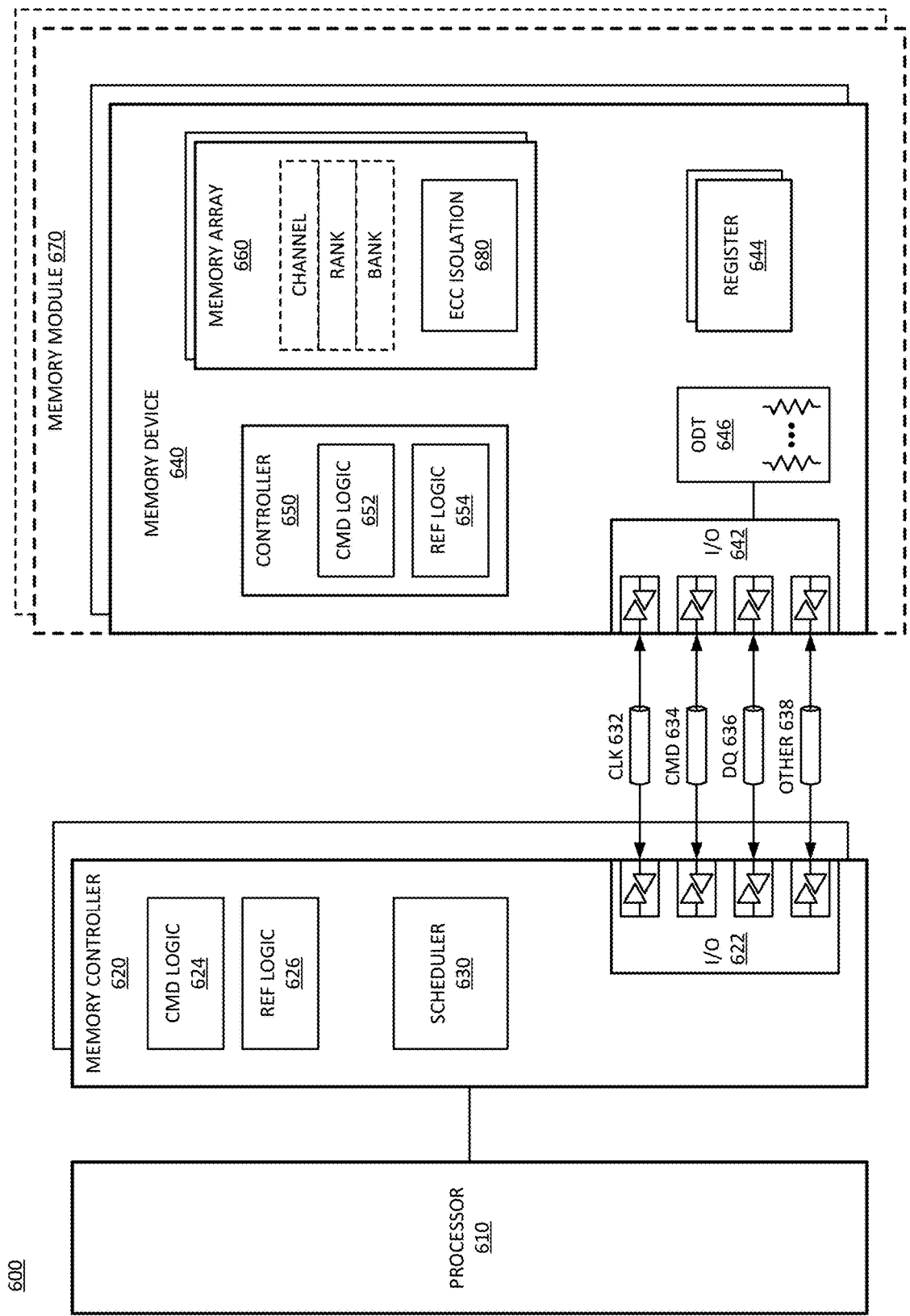
FIG. 6 is a block diagram of an example of a memory subsystem in which ECC sub-channel isolation can be implemented.

FIG. 6 is a block diagram of an example of a memory subsystem in which ECC sub-channel isolation can be implemented. System 600 includes a processor and elements of a memory subsystem in a computing device. System 600 is one example of a system that can incorporate a system compatible with diagram 202.

In one example, memory device 640 includes ECC isolation 680 in memory array 660. ECC isolation 680 represents hardware and logic to implement ECC isolation internally within a memory device, within a sub-division of a channel in accordance with any example herein. ECC isolation includes additional hardware resources to provide more driver circuitry to manage portions of a memory array as separate sub-channels for purposes of internal ECC operation. ECC isolation 680 can control the application of ECC by on-die ECC circuitry.

Processor 610 represents a processing unit of a computing platform that may execute an operating system (OS) and applications, which can collectively be referred to as the host or the user of the memory. The OS and applications execute operations that result in memory accesses. Processor 610 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 600 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (double data rate (DDR) version 4, JESD79-4, originally published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices. A memory device can include a nonvolatile, byte addressable media that stores data based on a resistive state of the memory cell, or a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Memory controller 620 represents one or more memory controller circuits or devices for system 600. Memory controller 620 represents control logic that generates memory access commands in response to the execution of operations by processor 610. Memory controller 620 accesses one or more memory devices 640. Memory devices 640 can be DRAM devices in accordance with any referred to above. In one example, memory devices 640 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 620 manages a separate memory channel, although system 600 can be configured to have multiple channels managed by a single controller, or to have multiple controllers on a single channel. In one example, memory controller 620 is part of host processor 610, such as logic implemented on the same die or implemented in the same package space as the processor.

Memory controller 620 includes I/O interface logic 622 to couple to a memory bus, such as a memory channel as referred to above. I/O interface logic 622 (as well as I/O interface logic 642 of memory device 640) can include pins, pads, connectors, signal lines, traces, or wires, or other hardware to connect the devices, or a combination of these. I/O interface logic 622 can include a hardware interface. As illustrated, I/O interface logic 622 includes at least drivers/transceivers for signal lines. Commonly, wires within an integrated circuit interface couple with a pad, pin, or connector to interface signal lines or traces or other wires between devices. I/O interface logic 622 can include drivers, receivers, transceivers, or termination, or other circuitry or combinations of circuitry to exchange signals on the signal lines between the devices. The exchange of signals includes at least one of transmit or receive. While shown as coupling I/O 622 from memory controller 620 to I/O 642 of memory device 640, it will be understood that in an implementation of system 600 where groups of memory devices 640 are accessed in parallel, multiple memory devices can include I/O interfaces to the same interface of memory controller 620. In an implementation of system 600 including one or more memory modules 670, I/O 642 can include interface hardware of the memory module in addition to interface hardware on the memory device itself. Other memory controllers 620 will include separate interfaces to other memory devices 640.

The bus between memory controller 620 and memory devices 640 can be implemented as multiple signal lines coupling memory controller 620 to memory devices 640. The bus may typically include at least clock (CLK) 632, command/address (CMD) 634, and write data (DQ) and read data (DQ) 636, and zero or more other signal lines 638. In one example, a bus or connection between memory controller 620 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 600 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 620 and memory devices 640. An example of a serial bus technology is 8B10B encoding and transmission of high-speed data with embedded clock over a single differential pair of signals in each direction. In one example, CMD 634 represents signal lines shared in parallel with multiple memory devices. In one example, multiple memory devices share encoding command signal lines of CMD 634, and each has a separate chip select (CS_n) signal line to select individual memory devices.

It will be understood that in the example of system 600, the bus between memory controller 620 and memory devices 640 includes a subsidiary command bus CMD 634 and a subsidiary bus to carry the write and read data, DQ 636. In one example, the data bus can include bidirectional lines for read data and for write/command data. In another example, the subsidiary bus DQ 636 can include unidirectional write signal lines for write and data from the host to memory, and can include unidirectional lines for read data from the memory to the host. In accordance with the chosen memory technology and system design, other signals 638 may accompany a bus or sub bus, such as strobe lines DQS. Based on design of system 600, or implementation if a design supports multiple implementations, the data bus can have more or less bandwidth per memory device 640. For example, the data bus can support memory devices that have either a ×4 interface, a ×8 interface, a ×16 interface, or other interface. The convention "×W," where W is an integer that refers to an interface size or width of the interface of memory device 640, which represents a number of signal lines to exchange data with memory controller 620. The interface size of the memory devices is a controlling factor on how many memory devices can be used concurrently per channel in system 600 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 640 and memory controller 620 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 640 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 640 represent memory resources for system 600. In one example, each memory device 640 is a separate memory die. In one example, each memory device 640 can interface with multiple (e.g., 2) channels per device or die. Each memory device 640 includes I/O interface logic 642, which has a bandwidth determined by the implementation of the device (e.g., ×16 or ×8 or some other interface bandwidth). I/O interface logic 642 enables the memory devices to interface with memory controller 620. I/O interface logic 642 can include a hardware interface, and can be in accordance with I/O 622 of memory controller, but at the memory device end. In one example, multiple memory devices 640 are connected in parallel to the same command and data buses. In another example, multiple memory devices 640 are connected in parallel to the same command bus, and are connected to different data buses. For example, system 600 can be configured with multiple memory devices 640 coupled in parallel, with each memory device responding to a command, and accessing memory resources 660 internal to each. For a Write operation, an individual memory device 640 can write a portion of the overall data word, and for a Read operation, an individual memory device 640 can fetch a portion of the overall data word. The remaining bits of the word will be provided or received by other memory devices in parallel.

In one example, memory devices 640 are disposed directly on a motherboard or host system platform (e.g., a PCB (printed circuit board) on which processor 610 is disposed) of a computing device. In one example, memory devices 640 can be organized into memory modules 670. In one example, memory modules 670 represent dual inline memory modules (DIMMs). In one example, memory modules 670 represent other organization of multiple memory devices to share at least a portion of access or control circuitry, which can be a separate circuit, a separate device, or a separate board from the host system platform. Memory modules 670 can include multiple memory devices 640, and the memory modules can include support for multiple separate channels to the included memory devices disposed on them. In another example, memory devices 640 may be incorporated into the same package as memory controller 620, such as by techniques such as multi-chip-module (MCM), package-on-package, through-silicon via (TSV), or other techniques or combinations. Similarly, in one example, multiple memory devices 640 may be incorporated into memory modules 670, which themselves may be incorporated into the same package as memory controller 620. It will be appreciated that for these and other implementations, memory controller 620 may be part of host processor 610.

Memory devices 640 each include one or more memory arrays 660. Memory array 660 represents addressable memory locations or storage locations for data. Typically, memory array 660 is managed as rows of data, accessed via wordline (rows) and bitline (individual bits within a row) control. Memory array 660 can be organized as separate channels, ranks, and banks of memory. Channels may refer to independent control paths to storage locations within memory devices 640. Ranks may refer to common locations across multiple memory devices (e.g., same row addresses within different devices) in parallel. Banks may refer to sub-arrays of memory locations within a memory device 640. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 640 include one or more registers 644. Register 644 represents one or more storage devices or storage locations that provide configuration or settings for the operation of the memory device. In one example, register 644 can provide a storage location for memory device 640 to store data for access by memory controller 620 as part of a control or management operation. In one example, register 644 includes one or more Mode Registers. In one example, register 644 includes one or more multipurpose registers. The configuration of locations within register 644 can configure memory device 640 to operate in different "modes," where command information can trigger different operations within memory device 640 based on the mode. Additionally or in the alternative, different modes can also trigger different operation from address information or other signal lines depending on the mode. Settings of register 644 can indicate configuration for I/O settings (e.g., timing, termination or ODT (on-die termination) 646, driver configuration, or other I/O settings).

In one example, memory device 640 includes ODT 646 as part of the interface hardware associated with I/O 642. ODT 646 can be configured as mentioned above, and provide settings for impedance to be applied to the interface to specified signal lines. In one example, ODT 646 is applied to DQ signal lines. In one example, ODT 646 is applied to command signal lines. In one example, ODT 646 is applied to address signal lines. In one example, ODT 646 can be applied to any combination of the preceding. The ODT settings can be changed based on whether a memory device is a selected target of an access operation or a non-target device. ODT 646 settings can affect the timing and reflections of signaling on the terminated lines. Careful control over ODT 646 can enable higher-speed operation with improved matching of applied impedance and loading. ODT 646 can be applied to specific signal lines of I/O interface 642, 622 (for example, ODT for DQ lines or ODT for CA lines), and is not necessarily applied to all signal lines.

Memory device 640 includes controller 650, which represents control logic within the memory device to control internal operations within the memory device. For example, controller 650 decodes commands sent by memory controller 620 and generates internal operations to execute or satisfy the commands. Controller 650 can be referred to as an internal controller, and is separate from memory controller 620 of the host. Controller 650 can determine what mode is selected based on register 644, and configure the internal execution of operations for access to memory resources 660 or other operations based on the selected mode. Controller 650 generates control signals to control the routing of bits within memory device 640 to provide a proper interface for the selected mode and direct a command to the proper memory locations or addresses. Controller 650 includes command logic 652, which can decode command encoding received on command and address signal lines. Thus, command logic 652 can be or include a command decoder. With command logic 652, memory device can identify commands and generate internal operations to execute requested commands.

Referring again to memory controller 620, memory controller 620 includes command (CMD) logic 624, which represents logic or circuitry to generate commands to send to memory devices 640. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 640, memory controller 620 can issue commands via I/O 622 to cause memory device 640 to execute the commands. In one example, controller 650 of memory device 640 receives and decodes command and address information received via I/O 642 from memory controller 620. Based on the received command and address information, controller 650 can control the timing of operations of the logic and circuitry within memory device 640 to execute the commands. Controller 650 is responsible for compliance with standards or specifications within memory device 640, such as timing and signaling requirements. Memory controller 620 can implement compliance with standards or specifications by access scheduling and control.

Memory controller 620 includes scheduler 630, which represents logic or circuitry to generate and order transactions to send to memory device 640. From one perspective, the primary function of memory controller 620 could be said to schedule memory access and other transactions to memory device 640. Such scheduling can include generating the transactions themselves to implement the requests for data by processor 610 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 620 typically includes logic such as scheduler 630 to allow selection and ordering of transactions to improve performance of system 600. Thus, memory controller 620 can select which of the outstanding transactions should be sent to memory device 640 in which order, which is typically achieved with logic much more complex that a simple first-in first-out algorithm. Memory controller 620 manages the transmission of the transactions to memory device 640, and manages the timing associated with the transaction. In one example, transactions have deterministic timing, which can be managed by memory controller 620 and used in determining how to schedule the transactions with scheduler 630.

In one example, memory controller 620 includes refresh (REF) logic 626. Refresh logic 626 can be used for memory resources that are volatile and need to be refreshed to retain a deterministic state. In one example, refresh logic 626 indicates a location for refresh, and a type of refresh to perform. Refresh logic 626 can trigger self-refresh within memory device 640, or execute external refreshes which can be referred to as auto refresh commands) by sending refresh commands, or a combination. In one example, controller 650 within memory device 640 includes refresh logic 654 to apply refresh within memory device 640. In one example, refresh logic 654 generates internal operations to perform refresh in accordance with an external refresh received from memory controller 620. Refresh logic 654 can determine if a refresh is directed to memory device 640, and what memory resources 660 to refresh in response to the command.

Figure 7:
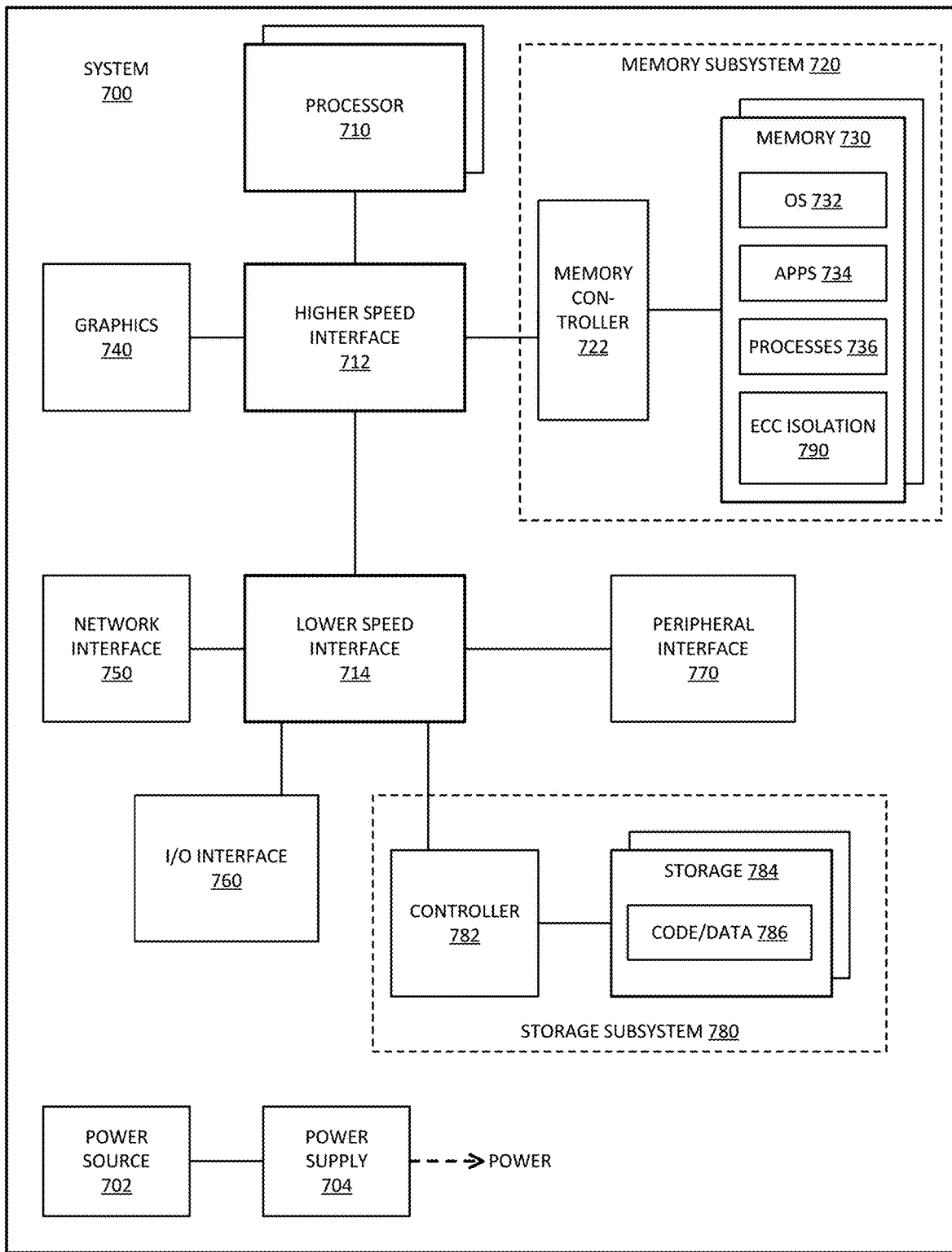
FIG. 7 is a block diagram of an example of a computing system in which ECC sub-channel isolation can be implemented.

FIG. 7 is a block diagram of an example of a computing system in which ECC sub-channel isolation can be implemented. System 700 represents a computing device in accordance with any example herein, and can be a laptop computer, a desktop computer, a tablet computer, a server, a gaming or entertainment control system, embedded computing device, or other electronic device. System 700 provides an example of a system that can incorporate a system compatible with diagram 202.

In one example, memory subsystem 720 includes ECC isolation 790 in memory 730. ECC isolation represents hardware and logic to implement ECC isolation internally within a memory device, within a sub-division of a channel in accordance with any example herein. ECC isolation includes additional hardware resources to provide more driver circuitry to manage portions of a memory array as separate sub-channels for purposes of internal ECC operation. ECC isolation 790 can control the application of ECC by on-die ECC circuitry.

System 700 includes processor 710 can include any type of microprocessor, central processing unit (CPU), graphics processing unit (GPU), processing core, or other processing hardware, or a combination, to provide processing or execution of instructions for system 700. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display or ultra high definition (UHD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more memory devices 730 such as read-only memory (ROM), flash memory, one or more varieties of random access memory (RAM) such as DRAM, 3DXP (three-dimensional crosspoint), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include stand-alone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, 3DXP, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
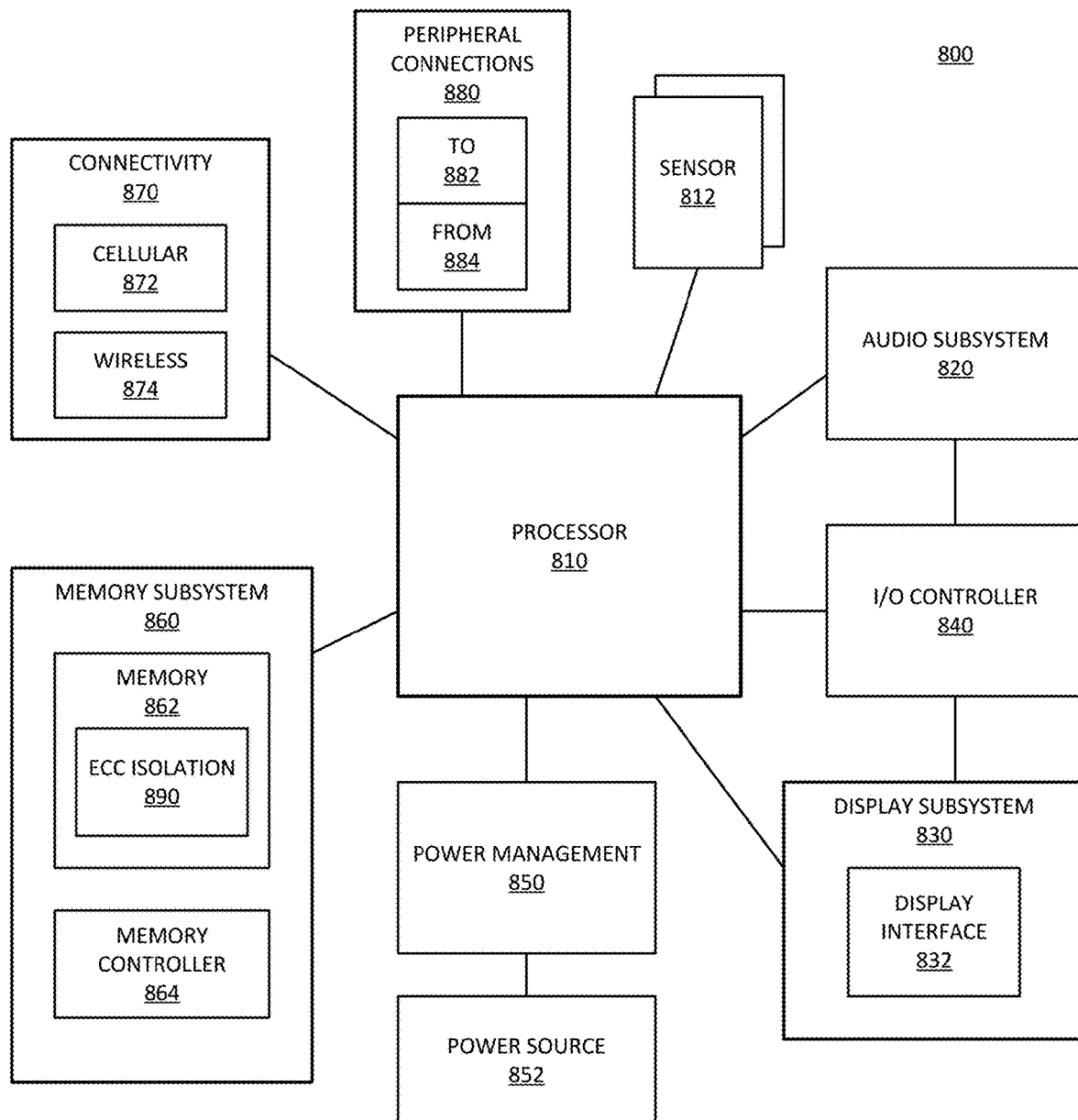
FIG. 8 is a block diagram of an example of a mobile device in which ECC sub-channel isolation can be implemented.

FIG. 8 is a block diagram of an example of a mobile device in which ECC sub-channel isolation can be implemented. System 800 represents a mobile computing device, such as a computing tablet, a mobile phone or smartphone, wearable computing device, or other mobile device, or an embedded computing device. It will be understood that certain of the components are shown generally, and not all components of such a device are shown in system 800. System 800 provides an example of a system that can incorporate a system compatible with diagram 202.

In one example, memory subsystem 860 includes ECC isolation 890 in memory 862. ECC isolation represents hardware and logic to implement ECC isolation internally within a memory device, within a sub-division of a channel in accordance with any example herein. ECC isolation includes additional hardware resources to provide more driver circuitry to manage portions of a memory array as separate sub-channels for purposes of internal ECC operation. ECC isolation 890 can control the application of ECC by on-die ECC circuitry.

System 800 includes processor 810, which performs the primary processing operations of system 800. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting system 800 to another device, or a combination. The processing operations can also include operations related to audio I/O, display I/O, or other interfacing, or a combination. Processor 810 can execute data stored in memory. Processor 810 can write or edit data stored in memory.

In one example, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one example, one or more sensors 812 couples to processor 810 via a frontend circuit integrated with processor 810. In one example, one or more sensors 812 couples to processor 810 via another component of system 800.

In one example, system 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 800, or connected to system 800. In one example, a user interacts with system 800 by providing audio commands that are received and processed by processor 810.

Display subsystem 830 represents hardware (e.g., display devices) and software components (e.g., drivers) that provide a visual display for presentation to a user. In one example, the display includes tactile components or touchscreen elements for a user to interact with the computing device. Display subsystem 830 includes display interface 832, which includes the particular screen or hardware device used to provide a display to a user. In one example, display interface 832 includes logic separate from processor 810 (such as a graphics processor) to perform at least some processing related to the display. In one example, display subsystem 830 includes a touchscreen device that provides both output and input to a user. In one example, display subsystem 830 includes a high definition (HD) or ultra-high definition (UHD) display that provides an output to a user. In one example, display subsystem includes or drives a touchscreen display. In one example, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to system 800 through which a user might interact with the system. For example, devices that can be attached to system 800 might include microphone devices, speaker or stereo systems, video systems or other display device, keyboard or keypad devices, buttons/switches, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of system 800. Additionally, audio output can be provided instead of or in addition to display output. In another example, if display subsystem includes a touchscreen, the display device also acts as an input device, which can be at least partially managed by I/O controller 840. There can also be additional buttons or switches on system 800 to provide I/O functions managed by I/O controller 840.

In one example, I/O controller 840 manages devices such as accelerometers, cameras, light sensors or other environmental sensors, gyroscopes, global positioning system (GPS), or other hardware that can be included in system 800, or sensors 812. The input can be part of direct user interaction, as well as providing environmental input to the system to influence its operations (such as filtering for noise, adjusting displays for brightness detection, applying a flash for a camera, or other features).

In one example, system 800 includes power management 850 that manages battery power usage, charging of the battery, and features related to power saving operation. Power management 850 manages power from power source 852, which provides power to the components of system 800. In one example, power source 852 includes an AC to DC (alternating current to direct current) adapter to plug into a wall outlet. Such AC power can be renewable energy (e.g., solar power, motion based power). In one example, power source 852 includes only DC power, which can be provided by a DC power source, such as an external AC to DC converter. In one example, power source 852 includes wireless charging hardware to charge via proximity to a charging field. In one example, power source 852 can include an internal battery or fuel cell source.

Memory subsystem 860 includes memory device(s) 862 for storing information in system 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one example, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable system 800 to communicate with external devices. The external device could be separate devices, such as other computing devices, wireless access points or base stations, as well as peripherals such as headsets, printers, or other devices. In one example, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, system 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that system 800 could both be a peripheral device ("to" 882) to other computing devices, as well as have peripheral devices ("from" 884) connected to it. System 800 commonly has a "docking" connector to connect to other computing devices for purposes such as managing (e.g., downloading, uploading, changing, synchronizing) content on system 800. Additionally, a docking connector can allow system 800 to connect to certain peripherals that allow system 800 to control content output, for example, to audiovisual or other systems.

In addition to a proprietary docking connector or other proprietary connection hardware, system 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, a memory device includes: an additional driver and additional subarray per channel; wherein the channel is treated as two sub-channels with error checking and correction per sub-portion internal to the memory device, and on the channel as a whole at the system level.

In one example, additional subarray is to store additional ECC (error checking and correction) data. In one example, the data bus is ×4 or ×8, where additional subarray and additional driver are only for ×4 implementation. In one example, the channel is 64 bits over a burst length. In one example, 128 bits are prefetched, and only 64 bits transferred to I/O (input/output) circuitry. In one example, the memory device comprises a dynamic random access memory (DRAM) device. In one example, the DRAM device comprises a synchronous DRAM (SDRAM) device compatible with a double data rate (DDR) standard.

In general with respect to the descriptions herein, in one example, a system includes: a controller; and a memory device including an additional driver and additional subarray per channel; wherein the channel is treated as two sub-channels with error checking and correction per sub-portion internal to the memory device, and on the channel as a whole at the system level.

In one example, additional subarray is to store additional ECC (error checking and correction) data. In one example, the data bus is ×4 or ×8, where additional subarray and additional driver are only for ×4 implementation. In one example, the channel is 64 bits over a burst length. In one example, 128 bits are prefetched, and only 64 bits transferred to I/O (input/output) circuitry. In one example, the memory device comprises a dynamic random access memory (DRAM) device. In one example, the DRAM device comprises a synchronous DRAM (SDRAM) device compatible with a double data rate (DDR) standard. In one example, the system further includes one or more of: a host processor device coupled to the memory device; a display communicatively coupled to a host processor; a network interface communicatively coupled to a host processor; or a battery to power the system.

In general with respect to the descriptions herein, in one example, a memory device includes: a hardware interface to couple to data signal lines to exchange data with a host; and error checking and correction (ECC) hardware to apply, internally to the memory device, ECC to N data bits as two groups of N/2 bits.

In one example, N equals 64. In one example, the memory device includes hardware to prefetch 128 bits of data and transfer only 64 bits of the data to I/O (input/output) circuitry of the hardware interface. In one example, the memory device further comprises a memory array, wherein the memory array includes multiple subarrays to provide the N data bits, wherein the memory array includes an additional subarray in excess of the N data bits to store additional ECC data. In one example, the memory device includes drivers associated with the subarrays, and wherein the memory device includes an additional driver to control access to the additional subarray. In one example, the hardware interface is to couple to a data bus that is ×4 or ×8, wherein the additional subarray and additional driver apply only when the hardware interface is to couple to a ×4 data bus. In one example, the N data bits comprises a channel, and wherein the ECC hardware treats the channel as two sub-channels having N/2 bits each, and wherein the host treats the channel as an N-bit channel for system-level ECC. In one example, the N data bits comprises a channel, and wherein the ECC hardware treats the channel as two sub-channels having N/2 bits each, with each sub-channel separately correctable. In one example, the memory device comprises a synchronous dynamic random access memory (SDRAM) device compatible with a double data rate (DDR) standard.

In general with respect to the descriptions herein, in one example, a system includes: multiple memory devices, wherein the memory device include a hardware interface to couple to data signal lines to exchange data with a host; and error checking and correction (ECC) hardware to apply, internally to the memory device, ECC to N data bits as two groups of N/2 bits; and a memory controller coupled to the memory devices, the memory controller to provide system-level ECC on data bits received from the memory devices.

In one example, N equals 64. In one example, the memory devices include hardware to prefetch 128 bits of data and transfer only 64 bits of the data to I/O (input/output) circuitry of the hardware interface. In one example, the memory devices include a memory array, wherein the memory array includes multiple subarrays to provide the N data bits, wherein the memory array includes an additional subarray in excess of the N data bits to store additional ECC data. In one example, the memory devices include drivers associated with the subarrays, and wherein the memory devices include an additional driver to control access to the additional subarray. In one example, the hardware interface is to couple to a data bus that is ×4 or ×8, wherein the additional subarray and additional driver apply only when the hardware interface is to couple to a ×4 data bus. In one example, the N data bits comprises a channel, and wherein the ECC hardware treats the channel as two sub-channels having N/2 bits each, and wherein the memory controller is to provide system-level ECC on the N data bits. In one example, the N data bits comprises a channel, and wherein the ECC hardware treats the channel as two sub-channels having N/2 bits each, with each sub-channel separately correctable. In one example, the memory devices comprise synchronous dynamic random access memory (SDRAM) devices compatible with a double data rate (DDR) standard. In one example, the system further includes one or more of: a host processor device coupled to the memory controller; a display communicatively coupled to a host processor; a network interface communicatively coupled to a host processor; or a battery to power the system.

In general with respect to the descriptions herein, in one example, a method includes: receiving a data access command for access to N data bits of a memory array of a memory device; and applying error checking and correction (ECC) internally to the memory device to the N data bits as two groups of N/2 bits.

In one example, N equals 64. In one example, applying ECC internally to the N data bits comprises applying ECC to the N data bits to send in response to a read command, including performing error correction on an individual group of N/2 bits. In one example, applying ECC internally to the N data bits comprises applying ECC to the N data bits received in conjunction with to a write command, including writing error codes for separate groups of N/2 bits. In one example, prefetching 128 bits of data and transferring only 64 bits of the data to I/O (input/output) circuitry of the memory device. In one example, the memory array includes multiple subarrays to provide the N bits, wherein the memory array includes an additional subarray in excess of the N bits to store additional ECC data. In one example, the memory device includes drivers associated with the subarrays, and wherein the memory device includes an additional driver to control access to the additional subarray. In one example, the memory device includes a hardware interface is to couple to a data bus that is x4 or x8, wherein the additional subarray and additional driver apply only when the hardware interface is to couple to a x4 data bus. In one example, the N data bits comprises a channel, and wherein applying ECC comprises treating the channel as two sub-channels having N/2 bits each, wherein a host coupled to the memory device treats the channel as an N-bit channel for system-level ECC. In one example, the N data bits comprises a channel, and wherein the ECC hardware treats the channel as two sub-channels having N/2 bits each, with each sub-channel separately correctable. In one example, the memory device comprises a synchronous dynamic random access memory (SDRAM) device compatible with a double data rate (DDR) standard.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory (DRAM) device, comprising:
    a memory array to store data, wherein for a memory access operation, data bits and error checking and correction (ECC) bits are prefetched from the memory array; and
    ECC hardware, internal to the DRAM device, to apply ECC, with a first group of a first half the data bits checked by a first half of the ECC bits, in parallel with a second group of a second half of the data bits checked by a second half of the ECC bits.

2. The DRAM device of claim 1, wherein the DRAM device includes hardware to prefetch 128 data bits and 8 ECC bits, wherein the ECC hardware is to check two groups of 64 data bits with two groups of 4 ECC bits.

3. The DRAM device of claim 2, further comprising:
    a hardware interface coupled with a memory controller;
    wherein the hardware interface is to exchange only 64 data bits of the 128 data bits with the memory controller for the memory access operation.

4. The DRAM device of claim 1, wherein the ECC hardware is to perform ECC on prefetched data bits for a read operation and correct an error in the data bits prior to sending of the data bits to a memory controller.

5. The DRAM device of claim 1, wherein the ECC hardware is to perform ECC on write data bits for a write operation to generate the ECC bits to store in the memory array.

6. The DRAM device of claim 1, wherein the DRAM device comprises a synchronous dynamic random access memory (SDRAM) device compatible with a double data rate (DDR) standard.

7. The DRAM device of claim 6, wherein the SDRAM device comprises a x4 data (DQ) interface, to exchange data over a burst length 18 (BL18).

8. A system comprising:
    multiple dynamic random access memory (DRAM) devices coupled in parallel, wherein a DRAM device includes
        a memory array to store data, wherein for a memory access operation, data bits and error checking and correction (ECC) bits are prefetched from the memory array; and
        ECC hardware, internal to the DRAM device, to apply ECC, with a first group of a first half the data bits checked by a first half of the ECC bits, in parallel with a second group of a second half of the data bits checked by a second half of the ECC bits; and
    a memory controller coupled to the DRAM devices, the memory controller to provide system-level ECC on data bits received from the DRAM devices in parallel.

9. The system of claim 8, wherein the DRAM device includes hardware to prefetch 128 data bits and 8 ECC bits, wherein the ECC hardware is to check two groups of 64 data bits with two groups of 4 ECC bits.

10. The system of claim 9, wherein the memory controller is to exchange only 64 data bits of the 128 data bits with each DRAM device for the memory access operation.

11. The system of claim 8, wherein the ECC hardware is to perform ECC on prefetched data bits for a read operation and correct an error in the data bits prior to sending of the data bits to the memory controller.

12. The system of claim 8, wherein the ECC hardware is to perform ECC on write data bits for a write operation to generate the ECC bits to store in the memory array.

13. The system of claim 8, wherein the DRAM device comprises a synchronous dynamic random access memory (SDRAM) device compatible with a double data rate (DDR) standard.

14. The system of claim 13, wherein the SDRAM device comprises a ×4 data (DQ) interface, to exchange data over a burst length 18 (BL18).

15. The system of claim 8, further comprising one or more of:
    a host processor device coupled to the memory controller;
    a display communicatively coupled to a host processor;
    a network interface communicatively coupled to a host processor; or
    a battery to power the system.

16. A method comprising:
    receiving a data access command for a memory access operation;
    prefetching data bits and error checking and correction (ECC) bits from a memory array of a memory device; and
    internally to the memory device, applying ECC to the data bits with the ECC bits, as a first group of a first half the data bits checked by a first half of the ECC bits in parallel with a second group of a second half of the data bits checked by a second half of the ECC bits.

17. The method of claim 16, wherein the prefetching comprises prefetching 128 data bits and 8 ECC bits, wherein applying the ECC comprises checking two groups of 64 data bits with two groups of 4 ECC bits.

18. The method of claim 16, wherein applying the ECC comprises performing ECC on prefetched data bits for a read operation and correcting an error in the data bits prior to sending the data bits to a memory controller.

19. The method of claim 16, wherein the memory device comprises a synchronous dynamic random access memory (SDRAM) device compatible with a double data rate (DDR) standard.

20. The method of claim 19, wherein the SDRAM device comprises a ×4 data (DQ) interface, to exchange data over a burst length 18 (BL18).

* * * * *